United States Patent
Huang et al.

(10) Patent No.: US 6,306,757 B1
(45) Date of Patent: Oct. 23, 2001

(54) METHOD FOR FORMING A MULTILEVEL INTERCONNECT

(75) Inventors: Keh-Ching Huang; Ming-Sheng Yang; Tong-Yu Chen; Tzu-Guey Jung, all of Hsin-Chu (TW)

(73) Assignee: United Microelectronics Corp., Hsin-Chu (TW)

(*) Notice: Subject to any disclaimer, the term of this patent is extended or adjusted under 35 U.S.C. 154(b) by 0 days.

(21) Appl. No.: 09/323,890

(22) Filed: Jun. 2, 1999

(51) Int. Cl.$^7$ ............................... H01L 21/4763
(52) U.S. Cl. ............................... 438/634; 438/627
(58) Field of Search ................... 438/628, 634, 438/644, 654, 672, 637; 257/751

(56) References Cited

U.S. PATENT DOCUMENTS 5,407,861 * 4/1995 Marangon et al. .................. 438/628
5,955,785 * 9/1999 Gardner et al. .................... 257/751
5,981,385 * 11/1999 Huang ............................... 438/672

* cited by examiner

Primary Examiner—David Nelms
Assistant Examiner—Dung Anh Le
(74) Attorney, Agent, or Firm—Bacon & Thomas

(57) ABSTRACT

A metallization method for forming multilevel interconnect is disclosed. The method includes firstly providing a first conductor layer on which there is a dielectric layer. A glue layer is then formed on the dielectric layer, followed by forming an opening from top surface of the glue layer to the first conductor layer. After forming a barrier layer on the glue layer and all surfaces in the opening, a second conductor is formed on the barrier layer and fills the opening. Subsequently, the second conductor layer and the barrier layer are removed until the glue layer exposes. A third conductor is defined on the glue layer and the second conductor. The product will solve the problem of high via resistivity caused by stripping solvent and etchant.

24 Claims, 3 Drawing Sheets

METHOD FOR FORMING A MULTILEVEL INTERCONNECT

BACKGROUND OF THE INVENTION

1. Field of the Invention

The present invention relates to a method for manufacturing a multilevel interconnect.

2. Description of the Prior Art

The conventional method for forming a multilevel interconnect is illustrated below. A metal 04 is firstly provided, on which there is an intermetal dielectric (IMD) 05 layer; a via is then formed. A first Ti/TiN layer, which is a couple of titanium nitride (TiN) film and underlying titanium (Ti) film, is formed on the IMD and all surfaces in the via. Therein, the portion located on IMD serves as a glue layer, and the other as a barrier layer 06. Next, a tungsten (W) layer 03 is formed on the Ti/TiN layer and planarized by chemical mechanical polishing (CMP) process. Therefore, the glue, which was located on IMD, is removed. The following process is sputtering a second Ti/TiN layer on the IMD and the residual tungsten plug. Surely, the second Ti/TiN layer serves as a glue layer, and a metal such as aluminum (Al) is then formed on it. The following procedures are used to define the metal. A photoresist is formed on the metal, then a mask and an exposure process are used to pattern the photoresist. After stripping the unnecessary portion of the photoresist, the metal is etched. Subsequently, the residual photoresist is stripped and the resultant is as shown in FIG. 1.

As described above, the conventional glue layer scheme employs thin sputtered layer of Ti 01/TiN 02 stack after W-CMP in order to recover the glue layer consumed by W-CMP. However, when unlanded via rule is used, this scheme suffered from Ti errosion problem. The electrochemical reaction between Ti 01 /solvent/W 03 will erode the Ti 01 film and result in high via resistivity.

For the foregoing reason, there is a need for a method for forming a multilevel interconnect, which can prevent the occurrence of high via resistivity from stripping the photoresist.

SUMMARY OF THE INVENTION

In accordance with the present invention, a method is provided for forming the multilevel interconnect that substantially solves the problem of high via resistivity. In one embodiment, a conductor layer on which a dielectric layer is provided firstly. A first Ti/TiN layer is formed on the dielectric layer. Next, an opening, such as a via or a contact hole, is formed. A second Ti/TiN layer is formed on the first Ti/TiN layer and all surfaces in the opening. Its followed by forming a tungsten (W) on the second Ti/TiN layer to fill the opening. Chemical mechanical polishing (CMP) is used to polish the tungsten and the second Ti/TiN layer until the first Ti/TiN layer exposes. Lastly, a metal layer is defined on the first Ti/TiN layer, therein the metal layer contacts with tungsten.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention changes mainly the sequence of the glue layer process in fabrication of a multilevel interconnect.

Figure 2:
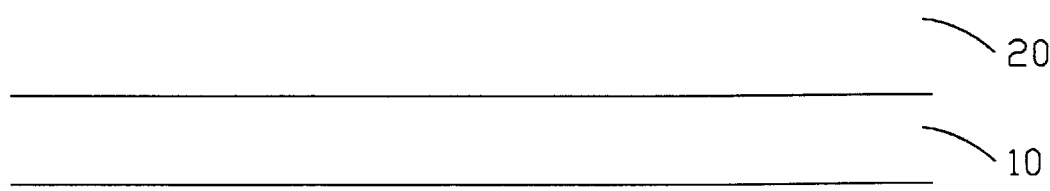
FIG. 2 shows the primary structure provided firstly in one embodiment of the present invention.

Referring to FIG. 2, a first conductor layer 10 on which a dielectric layer 20 is firstly provided. The first conductor is probably metal or substrate, and the metal comprises aluminum or copper.

Figure 1:
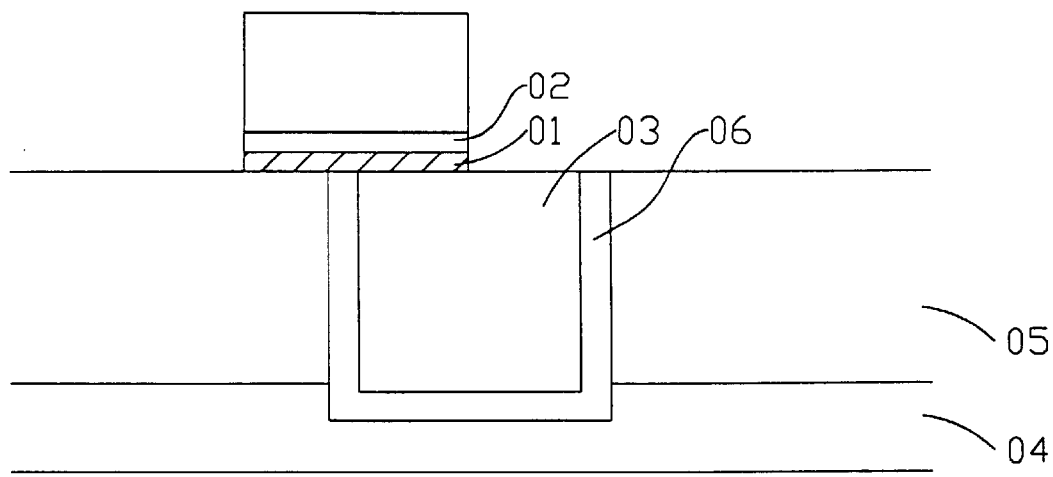
FIG. 1 shows the structure formed by conventional method.
Figure 3:
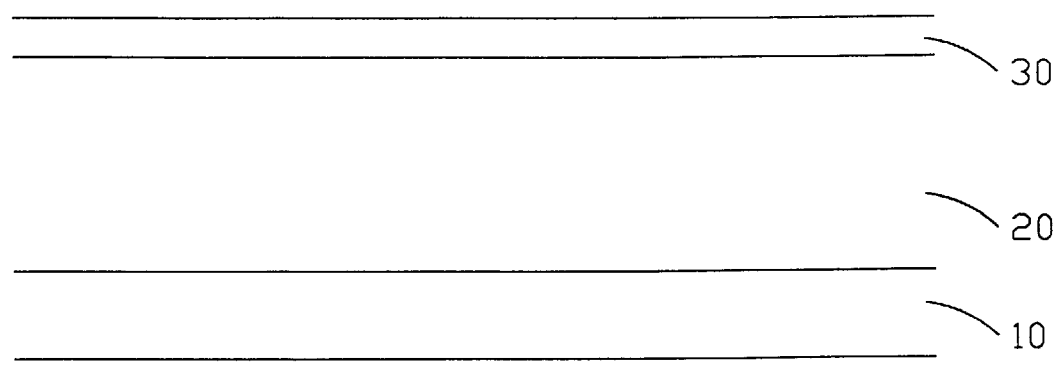
FIG. 3 shows mainly the glue layer formed on the primary structure.

Referring to FIG. 3, a Ti/TiN layer 30, serving as a glue layer, is formed on the dielectric layer 20. The Ti/TiN layer, as shown in FIG. 1, is a couple of a titanium nitride (TiN) film 02 and an underlying titanium (Ti) film 01. Therein, after the Ti film 01 is sputtered, a rapid thermal processing (RTP) or reactive sputtering is used for TiN film 02. In the glue layer, both the Ti 01 film's and the TiN 02 film's thickness are about 20 nm respectively.

Figure 4:
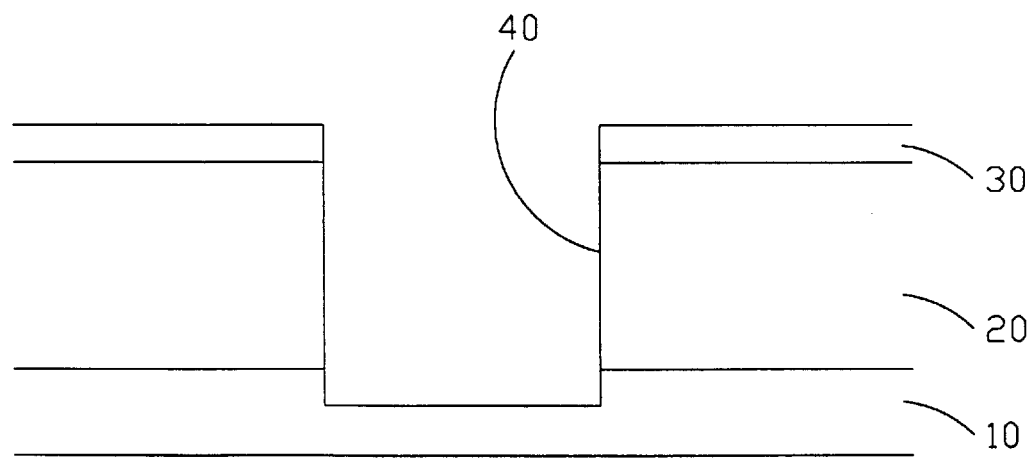
FIG. 4 shows mainly the opening formed on the previous structure.

Referring to FIG. 4, photolithography and etching are used to form an opening 40 from top surface of the glue layer 30 to the first conductor layer 10. The opening 40 is referred to as a via or a contact hole under the condition where the first conductor 10 is equivalent to a metal or a substrate respectively.

Figure 5:
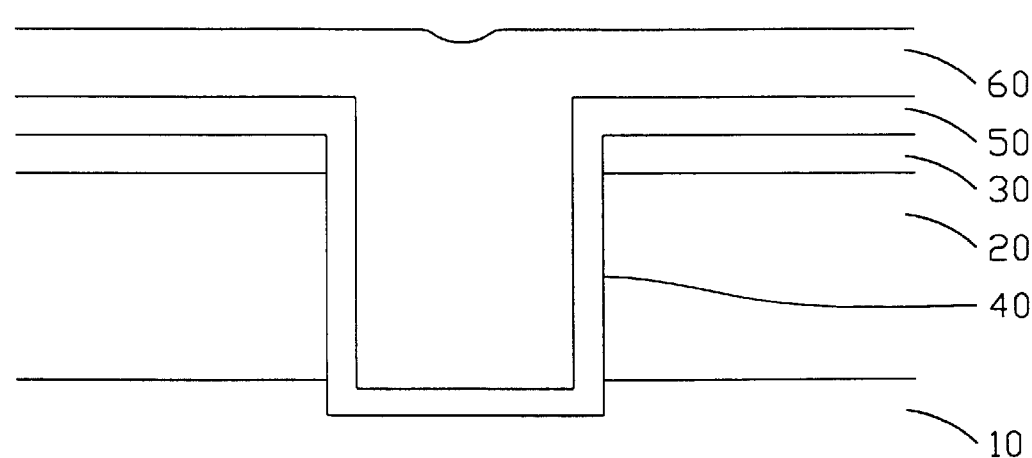
FIG. 5 shows mainly the barrier layer and the tungsten that is not polished yet.

Referring to FIG. 5, a second Ti/TiN layer 50, serving as a barrier layer, is formed on the glue layer 30 and all surfaces in the opening 40. A second conductor 60, such as tungsten (W) or aluminum (Al), is subsequently formed on the second Ti/TiN layer 50 by chemical vapor deposition (CVD).

Figure 6:
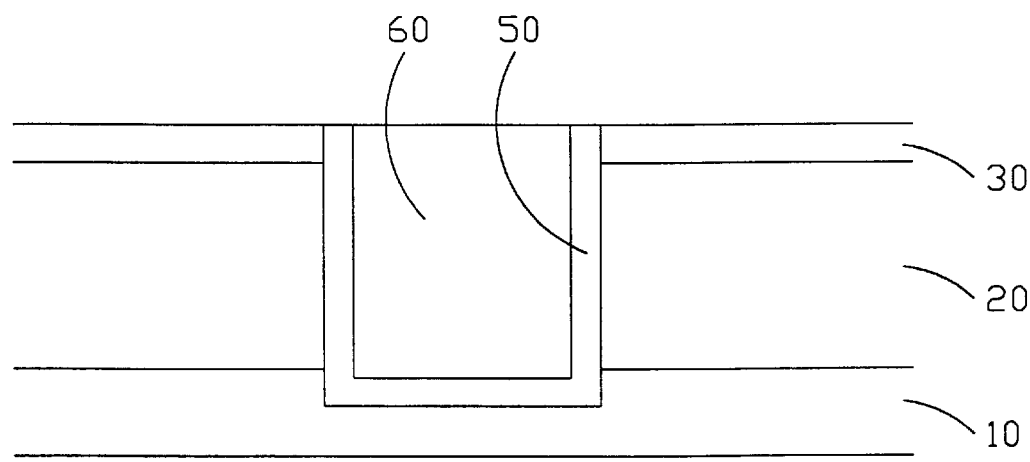
FIG. 6 shows the tungsten serving as a plug after polished.

Referring to FIG. 6, etching back process or chemical mechanical polishing (CMP) is used to remove the unnecessary portion of second conductor. After that, the second Ti/TiN layer 50 which is located on the glue layer 30 and serves as the stop layer is removed along with the removed portion of the second conductor 60. Then, the glue layer 30 exposes. The residual second conductor 60 serves as a plug for multilevel interconnect.

Figure 7:
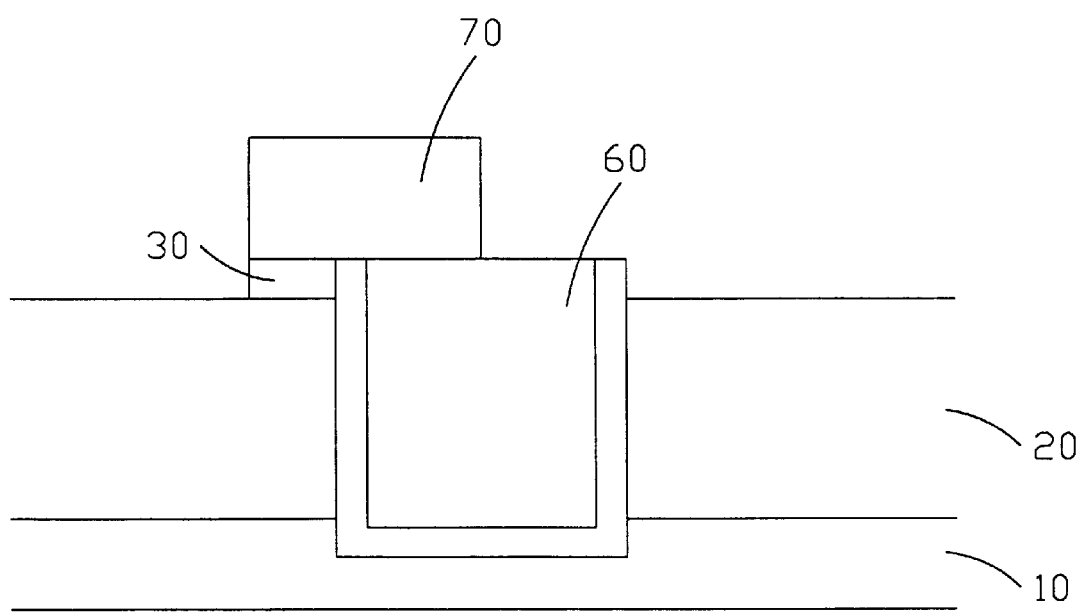
FIG. 7 shows the structure formed by the present invention.

Referring to FIG. 7, a metal layer, such as aluminum or copper, served as a third conductor 70, is defined on the glue layer and contacts directly with the plug. During the forming, the glue layer is etched except the portion under the third conductor 70.

The solvent for photolithography and the etchant for etching will not cause the electrochemical reaction between Ti/solvent/W. Therefore, the interface between Ti and W will not be reduced, so that the high via resistivity will not occur.

Although specific embodiments have been illustrated and described, it will be obvious to those skilled in the art that various modifications may be made without departing from what is intended to be limited solely by the appended claims.

What is claimed is:

1. A method for forming a multilevel interconnect comprises:

providing a first conductor layer, and there is a dielectric layer on said first conductor layer;

forming a glue layer on said dielectric layer;

forming an opening from top surface of said glue layer to said first conductor layer;

forming a barrier layer on said glue layer and all surfaces in said opening;

forming a second conductor layer on said barrier layer, and said second conductor layer fills said opening;

proceeding a chemical mechanical polish process to remove said second conductor layer and said barrier layer until exposing said glue layer; and forming a third conductor layer on said glue layer and said second conductor layer.

2. The method according to claim 1, wherein said first conductor comprises aluminum.

3. The method according to claim 1, wherein said first conductor comprises copper.

4. The method according to claim 1, wherein said first conductor comprises a substrate.

5. The method according to claim 1, wherein said dielectric layer comprises oxide.

6. The method according to claim 1, wherein said glue layer comprises a Ti/TiN layer.

7. The method according to claim 1, wherein said opening includes a via.

8. The method according to claim 1, wherein said opening includes a contact hole.

9. The method according to claim 1, wherein said barrier layer comprises a Ti/TiN layer.

10. The method according to claim 1, wherein said second conductor comprises metal.

11. The method according to claim 10, wherein said metal comprises tungsten (W).

12. The method according to claim 10, wherein said metal comprises aluminum.

13. The method according to claim 1, wherein the said third conductor comprises metal.

14. The method according to claim 13, wherein said metal comprises aluminum.

15. The method according to claim 13, wherein said metal comprises copper.

16. The method according to claim 1, wherein said third conductor is defined.

17. A method for forming a multilevel interconnect comprises:

providing a first conductor layer, and there is a dielectric layer on said conductor layer;

forming a first Ti/TiN layer on said dielectric layer;

forming an opening from top surface of said first Ti/TiN layer to said first conductor layer;

forming a second Ti/TiN layer on said first Ti/TiN layer and all surfaces in said opening;

forming a tungsten on said second Ti/TiN layer, and said tungsten fills said opening;

using chemical mechanical polishing to polish said tungsten and said second Ti/TiN layer until said first Ti/TiN layer exposes; and defining a metal layer on said first Ti/TiN layer, and said metal layer contacts with said tungsten.

18. The method according to claim 17, wherein said first conductor layer comprises metal.

19. The method according to claim 17, wherein said first conductor layer comprises a substrate.

20. The method according to claim 17, wherein said dielectric layer comprises oxide.

21. The method according to claim 17, wherein said opening includes a via.

22. The method according to claim 17, wherein said opening includes a contact hole.

23. The method according to claim 17, wherein said metal layer comprises aluminum.

24. The method according to claim 17, wherein said metal layer comprises copper.

* * * * *